(12) United States Patent
Redaelli

(10) Patent No.: US 11,715,545 B2
(45) Date of Patent: *Aug. 1, 2023

(54) IN-SYSTEM TEST OF A MEMORY DEVICE

(71) Applicant: Micron Technology, Inc., Boise, ID (US)

(72) Inventor: Marco Redaelli, Munich (DE)

(73) Assignee: Micron Technology, Inc., Boise, ID (US)

(*) Notice: Subject to any disclaimer, the term of this patent is extended or adjusted under 35 U.S.C. 154(b) by 69 days.

This patent is subject to a terminal disclaimer.

(21) Appl. No.: 17/371,830

(22) Filed: Jul. 9, 2021

(65) Prior Publication Data
US 2021/0335441 A1 Oct. 28, 2021

Related U.S. Application Data

(63) Continuation of application No. 16/521,977, filed on Jul. 25, 2019, now Pat. No. 11,069,420.

(51) Int. Cl.
*G11C 29/00* (2006.01)
*G11C 29/38* (2006.01)
*G06F 13/40* (2006.01)
*B60R 1/00* (2022.01)
*F16H 61/12* (2010.01)

(52) U.S. Cl.
CPC .............. *G11C 29/38* (2013.01); *B60R 1/00* (2013.01); *F16H 61/12* (2013.01); *G06F 13/4022* (2013.01); *B60R 2300/806* (2013.01); *F16H 2061/1208* (2013.01)

(58) Field of Classification Search
CPC ............ G11C 29/38; G11C 2029/4402; G11C 2029/5602; G11C 2029/5604; G11C 29/16; G11C 29/46; G11C 29/48; G11C 29/56008; G11C 29/36; G11C 29/56; B60R 1/00; B60R 2300/806; F16H 61/12; F16H 2061/1208; G06F 13/4022

See application file for complete search history.

(56) References Cited

U.S. PATENT DOCUMENTS

| | | | |
|---|---|---|---|
| 6,002,868 A * | 12/1999 | Jenkins ................ | G06F 11/273 702/123 |
| 6,418,392 B1 | 7/2002 | Rust et al. | |
| 7,099,797 B1 | 8/2006 | Richard | |
| 7,146,572 B2 | 12/2006 | Richardson | |
| 7,401,271 B1 | 7/2008 | MacLellan | |
| 9,411,537 B2 | 8/2016 | Kim et al. | |
| 9,626,112 B2 | 4/2017 | Adam | |

(Continued)

*Primary Examiner* — Albert Decady
*Assistant Examiner* — Enamul M Kabir
(74) *Attorney, Agent, or Firm* — Brooks, Cameron & Huebsch, PLLC

(57) ABSTRACT

An example system includes a processing resource and a switch board coupled to a system under test (SUT) and the processing resource. The SUT includes a memory device. The switch board can be configured to provide power to the SUT, communicate a first signal from the SUT to the processing resource, and provide a second signal to the SUT that simulates an input to the SUT during operation of the SUT. The processing resource can be configured to receive a function, selected from a library of functions, to execute during a test of the memory device and cause the switch board to provide the second signal during the test of the SUT.

19 Claims, 4 Drawing Sheets

(56) References Cited

U.S. PATENT DOCUMENTS

| | | | |
|---|---|---|---|
| 9,715,442 B2* | 7/2017 | Alexander | G06F 11/3664 |
| 9,905,307 B1 | 2/2018 | Ghai | |
| 11,308,002 B2* | 4/2022 | Gnanasambandam | G06V 20/46 |
| 2004/0039550 A1 | 2/2004 | Myers | |
| 2005/0258846 A1 | 11/2005 | Lee | |
| 2006/0279291 A1* | 12/2006 | Fielding | G01R 1/04 |
| | | | 324/503 |
| 2007/0207800 A1 | 9/2007 | Daley | |
| 2008/0126632 A1* | 5/2008 | Baier | G06F 11/3648 |
| | | | 710/100 |
| 2009/0183039 A1 | 7/2009 | Borkenhagen | |
| 2010/0229042 A1 | 9/2010 | Goyal | |
| 2011/0035095 A1* | 2/2011 | Chinnadurai | G07C 5/0858 |
| | | | 701/31.4 |
| 2012/0191964 A1* | 7/2012 | Lee | G06F 11/2289 |
| | | | 713/2 |
| 2013/0111505 A1* | 5/2013 | Frick | G06F 11/263 |
| | | | 719/328 |
| 2013/0211663 A1* | 8/2013 | Kirsch | G01R 31/2825 |
| | | | 701/32.7 |
| 2014/0032984 A1 | 1/2014 | Lee | |
| 2014/0082250 A1 | 3/2014 | Yoo et al. | |
| 2014/0082404 A1 | 3/2014 | Kang et al. | |
| 2014/0100714 A1* | 4/2014 | Linn | G01M 7/02 |
| | | | 701/2 |
| 2014/0163811 A1* | 6/2014 | Petersen | G06F 17/00 |
| | | | 701/32.8 |
| 2014/0189229 A1 | 7/2014 | Schoenborn | |
| 2014/0189433 A1 | 7/2014 | Schoenborn | |
| 2014/0229666 A1 | 8/2014 | Schoenborn | |
| 2015/0002408 A1 | 1/2015 | Mozak | |
| 2015/0301108 A1* | 10/2015 | Hamid | G01R 31/31813 |
| | | | 714/724 |
| 2016/0146888 A1* | 5/2016 | Vooka | G06F 11/27 |
| | | | 714/734 |
| 2017/0115346 A1* | 4/2017 | Sonawane | G01R 31/2803 |
| 2017/0213585 A1 | 7/2017 | Schoenborn | |
| 2017/0228306 A1* | 8/2017 | Edwards | G06F 11/2247 |
| 2017/0228307 A1 | 8/2017 | Edwards | |
| 2017/0228310 A1 | 8/2017 | Edwards | |
| 2017/0337752 A1* | 11/2017 | Holdren | G07C 5/0816 |
| 2018/0248782 A1* | 8/2018 | Scales | H04L 43/50 |
| 2018/0309656 A1 | 10/2018 | Regev | |
| 2018/0354433 A1* | 12/2018 | Melson | H04M 1/72463 |
| 2019/0050322 A1* | 2/2019 | Bhojan | G06N 5/003 |
| 2019/0051370 A1* | 2/2019 | Azam | G11C 29/36 |
| 2019/0303759 A1* | 10/2019 | Farabet | G06V 20/56 |
| 2020/0381071 A1* | 12/2020 | Organ | G11C 29/022 |
| 2021/0019219 A1 | 1/2021 | Patel | |

\* cited by examiner

IN-SYSTEM TEST OF A MEMORY DEVICE

PRIORITY INFORMATION

This application is a Continuation of U.S. application Ser. No. 16/521,977, filed on Jul. 25, 2019, which will issue as U.S. Pat. No. 11,069,420 on Jul. 20, 2021, the contents of which are incorporated herein by reference.

TECHNICAL FIELD

The present disclosure relates generally to semiconductor memory and methods, and more particularly, to apparatuses and methods related to system-level in-system testing of a memory device.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

DETAILED DESCRIPTION

Figure 1:
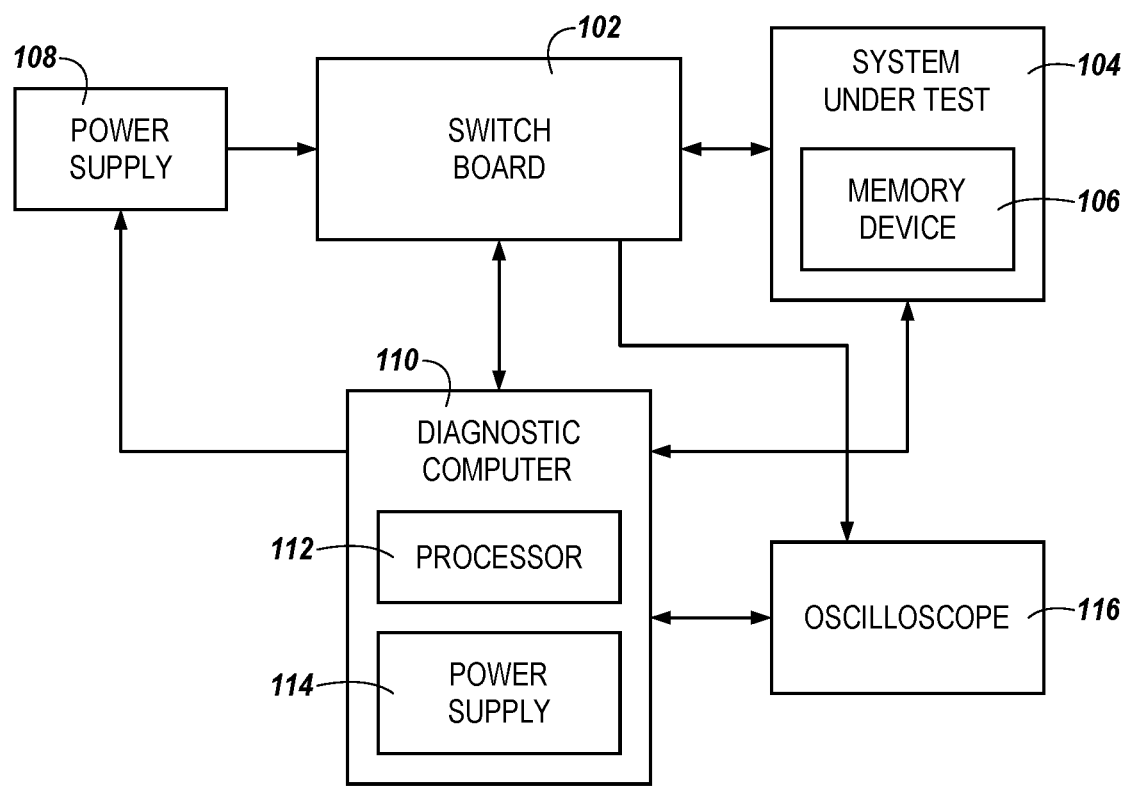
FIG. 1 is a block diagram of a system for system-level in-system testing of a memory device in accordance with a number of embodiments of the present disclosure.

The present disclosure includes apparatuses and methods related to in-system testing of a memory device. As used herein, "in-system testing" refers to testing performed on a component (e.g., sub-system) of a system while the component is in-place (e.g., coupled to) the system. In-system testing can be system-level testing. As used herein, "system-level testing" refers to testing performed on a component of a system to evaluate operation of the component within the system.

An example system includes a processing resource and a switch board coupled to a system under test (SUT) and the processing resource. The SUT can include a memory device. The switch board can be configured to provide power to the SUT, communicate a first signal from the SUT to the processing resource, and provide a second signal to the SUT that simulates an input to the SUT during operation of the SUT. The processing resource can be configured to receive a function, selected from a library of functions, to execute during a test of the memory device and cause the switch board to provide the second signal during the test of the SUT.

A memory device can be a component of a system (e.g., a subsystem). A system including a memory device can be intended to have a long use life (for example, greater than ten years). System-level testing (e.g., diagnostic testing, debugging, and/or troubleshooting) of a memory device, or a portion thereof, can be performed to verify that the memory device, or the portion thereof, will function for the expected use life of the system. For example, reliability, maintainability, and/or availability of a memory device can be tested to provide quality control, determine a failure of the memory device, diagnose errors of the memory device, etc. During system-level testing of a memory device, the system including the memory device can be referred to as a system under test (SUT). Previous approaches to system-level testing of a memory device may include removal of the memory device from a system including the memory device to perform component-level testing. For example, some previous approaches may include using automated testing equipment (ATE). As used herein, "automated testing equipment" refers to an apparatus that performs tests (e.g., diagnostic tests) on a system under test, equipment under test, or a unit under test using automation to perform measurements (e.g., perform diagnostic tests) and evaluate the results of the measurements.

ATE-based approaches may be costly, for example, due to the complexity of some ATE and/or ATE being constructed to perform particular diagnostic tests. For example, the manufacturer of the component may not be the manufacturer of the system. As a result, some ATE-based approaches may be time consuming because a customer has to send the component to be tested (e.g., a memory device) to the manufacturer of the component so that the manufacturer of the component can use its ATE to perform tests on the component. Further, ATE-based approaches may be difficult to perform on a regular basis (e.g., periodically) on a component because the component, or the system including the component, may have to be relocated to where the ATE is in order to perform testing using the ATE. Thus, ATE-based approaches may be difficult to scale, modularize, and/or perform quickly and/or efficiently.

ATE-based approaches may include removing a component from a system prior to performing system-level testing of the component. For example, in some approaches, a memory device may be de-soldered from a circuit board of a system to which it is coupled during operation, reconditioned to establish the electrical connections, and subsequently tested using ATE. The component may be subsequently reinstalled into the system.

In contrast, embodiments of the presents disclosure provide system-level testing of a memory device that can be performed in-system. Embodiments of the present disclosure provide system-level testing of a memory device of a system that can be performed without removing the memory device from the system. For example, system-level testing of a memory device can be performed without de-soldering the memory device. This can reduce costs, the amount of time to perform testing and/or debugging of a memory device, and/or risk of damage to a memory device during testing and/or debugging of the memory device. System-level testing of the memory device can be performed during a product design-in phase of the system, system production, and/or return material authorization (RMA) of the memory device, for example.

At least one embodiment includes hardware infrastructure and/or software infrastructure. The hardware infrastructure can include components to perform system-level in-system testing of a memory device, such as that described in association with FIGS. 1-2. The software infrastructure can include a library of functions to design (e.g., develop) system-level in-system testing of a memory device, execute (e.g., control and/or manage) system-level in-system testing of a memory device, and/or store and/or analyze results from system-level in-system testing of a memory device. For example, at least one embodiment can provide and/or analyze boot times of a system, solid state drive (SSD) Self-Monitoring, Analysis and Reporting Technology (S.M.A.R.T.) attribute analysis, and/or embedded multimedia controller (eMMC) health status parameter analysis.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n," "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of a system for system-level in-system testing of a memory device in accordance with a number of embodiments of the present disclosure. The system can include a switch board 102 coupled to a SUT 104. The SUT 104 can include a memory device 106 of which system-level in-system testing and/or debugging is to be performed. The switch board 102 is described further in association with FIG. 2.

In at least one embodiment, the SUT 104 can include an in-vehicle infotainment (IVI) system that includes the memory device 106. An IVI system, for instance, can be configured to provide audio and/or video entertainment, navigation, etc. for a vehicle. Embodiments of the present disclosure are not limited to the SUT 104 include an IVI system. For example, the SUT 104 can include an engine control system configured to control actuators of the engine of the vehicle. An engine control system can be configured to control ignition timing, air-to-fuel ratios, etc. of a vehicle, for example. The SUT 104 can include a vehicle control system configured to control engine and/or vehicle performance. The SUT 104 can include a powertrain system configured to control the powertrain of the vehicle. The SUT 104 can include a braking system configured to control and/or read data corresponding to the braking system of the vehicle. The SUT 104 can include a body control system configured to control body features of the vehicle such as power windows, power seats, etc. The SUT 104 can include an advanced driver-assistance system (ADAS), such as adaptive cruise control (ACC) or lane assistant, for example, configured to control maneuvering and/or propulsion systems of the vehicle.

The memory device 106 can include one or more memory arrays, which can be DRAM arrays (e.g., a 3T DRAM array), SRAM arrays, STT RAM arrays, PCRAM arrays, TRAM arrays, RRAM arrays, NAND flash arrays, NOR flash arrays, solid state drive (SSD), eMMC, and/or universal flash storage (UFS), for instance. The memory arrays can comprise memory cells arranged in rows coupled by word lines and columns coupled by digit lines. In at least one embodiment, the memory device 106 can be a random access memory (RAM) device. For example, the memory device 106 can be a volatile random access memory (RAM) device such as a dynamic random-access memory (DRAM) device, static random-access memory (SRAM) device, or other volatile memory devices. However, embodiments of the present disclosure are not so limited. For example, the memory device 106 can be a non-volatile memory device such as a read only media (ROM), a flash memory (e.g., a solid state non-volatile computer storage media such as an electrically erasable programmable read-only memory (EEPROM), NAND-type and/or NOR-type flash memory device such as a memory card, SSD, eMMC, or UFS).

The switch board 102 can be coupled to a power supply 108 (e.g., a programmable power supply (PPS) or a power waveform generator). The switch board 102 can be configured to provide power from the power supply 108 to the SUT 104 and/or the memory device 106. The switch board 102 can be configured to provide trigger signals to components coupled thereto. The switch board 102 can be configured to digitize analog signals from the memory device 104 and/or the SUT 104.

A diagnostic computer 110 can be coupled to the switch board 102. The diagnostic computer 110 can include a processing resource 112 (e.g., a processor) and a power supply 114. The power supply 114 can provide power to the switch board 102 for operation of the switch board 102 via a universal serial bus (USB) connection, for example, between the diagnostic computer 110 and the switch board 102. The diagnostic computer 110 can run any operating system such as MICROSOFT WINDOWS®, MACOS®, ANDROID®, LINUX®, and UNIX®. The diagnostic computer 110 can be coupled to the power supply 108 to control the power supply 108 (e.g., provide settings to the power supply 108).

The diagnostic computer 110 can include a memory (not shown) configured to store a library of functions (e.g., application programming interface (API) functions). One or more of the functions can be executed by the processing resource 112 to perform system-level in-system testing of the memory device 106. An example of such a library of functions is described further in association with FIG. 3. The functions can be used to a library of functions to design and/or execute system-level in-system testing of the memory device 106, execute (e.g., control and/or manage) system-level in-system testing of the memory device 106, and/or store and/or analyze results from system-level in-system testing of the memory device 106. The functions can provide access to the SUT 104 and/or the memory device 106. The functions can provide post-processing of data collected during system-level in-system testing of the memory device 106.

The library of functions can be maintained by the manufacturer of the memory device 104. A user (e.g., a customer such as the manufacturer of the SUT 104) can select one or more functions from the library to be executed during in-system testing of the memory device 106. For example, the processing resource 112 can receive a user selection of API functions from a library of API functions. The processing resource 112 can perform a system-level in-system test of a memory device of a SUT based on the user selection of API functions. The processing resource 112 can, during the system-level in-system test, detect a particular event of the SUT based on communications (e.g., datalog files) received from the SUT. As used herein, a "datalog file" refers to a file generated by a device or a system that containing a record of inputs received, operations performed, functions executed, and outputs generated by the device or system. To detect the particular event, the processing resource 112 can monitor a GPIO signal output from the SUT and detect a change in the GPIO signal. To detect the particular event, the processing resource 112 can parse a datalog file of the SUT for an indication of the particular event. The processing resource 112 can, responsive to detecting the particular event, record communications between the memory device and the SUT. The processing resource 112 can, responsive to detecting the particular event, synchronize the particular event and an event of the user selection of API functions The diagnostic computer 110 can be configured to receive a datalog file of the SUT 104, a datalog file of the memory device 106, and/or a test session datalog file. In at least one embodiment, the processing resource 112 can be configured to parse (e.g., search) a datalog file for an indication of a particular event. For example, the processing resource 112 can be configured to parse a datalog file of the SUT 104, a datalog file of the memory device 106, and/or a test session datalog file for a particular text string (e.g., a keyword). The text string can correspond to an error of the SUT 104 or the memory device 106. The text string can correspond to an event of the SUT 104 or the memory device 106.

At least one diagnostic device can be coupled to the switch board 102, the diagnostic computer 110, and/or the SUT 104. For example, as illustrated in FIG. 1, an oscilloscope 116 can be coupled to the switch board 102 and the diagnostic computer 110. Although not illustrated in FIG. 1, the switch board 102 can be coupled to a protocol analyzer and/or a logic analyzer in place of or in addition to the oscilloscope 116. Although not illustrated in FIG. 1, a level shifter can be coupled to the switch board 102. A level shifter can be used to adapt signal levels to generate trigger signals.

Figure 2:
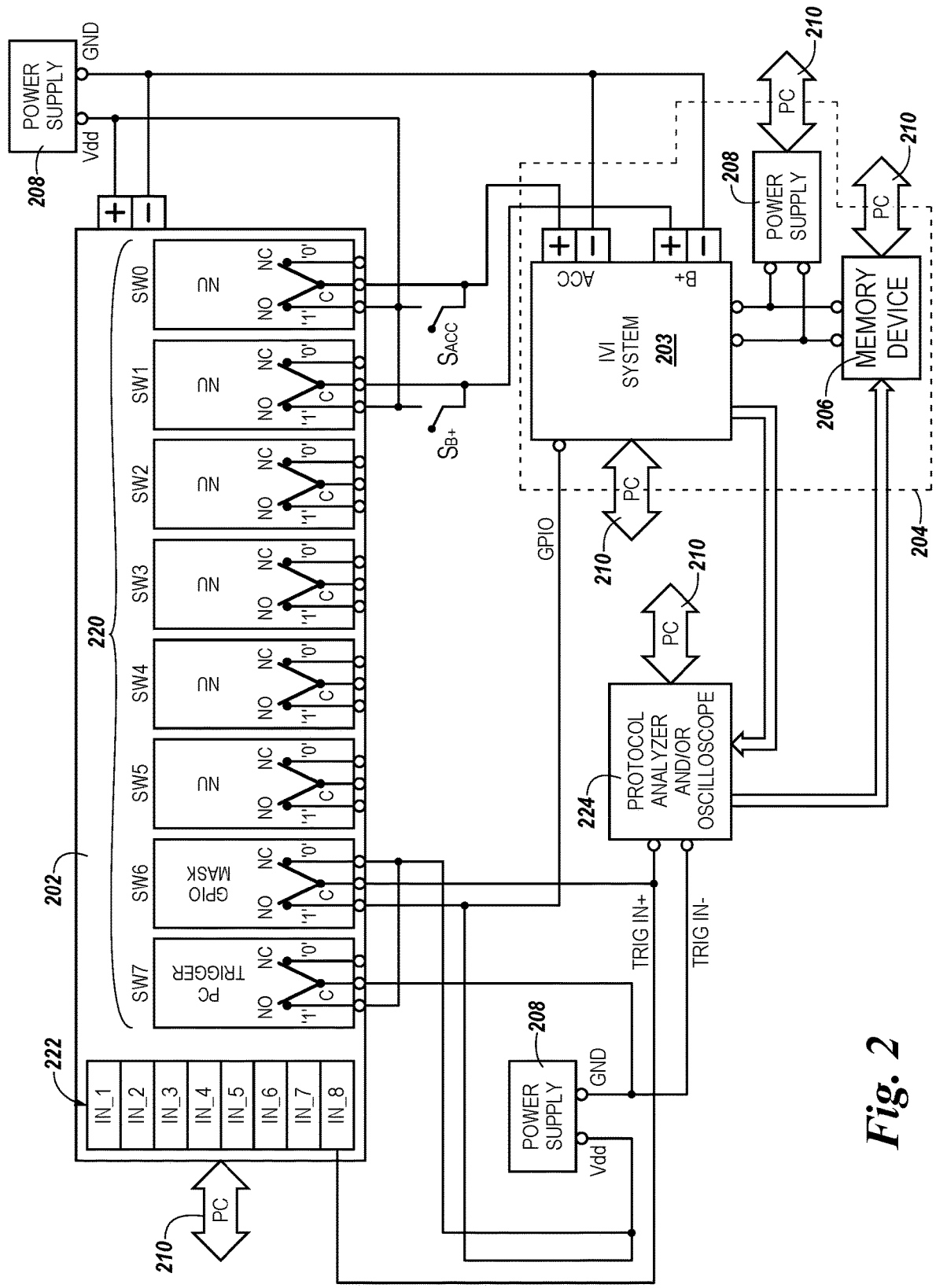
FIG. 2 is a block diagram of an apparatus for system-level in-system testing of a memory device in accordance with a number of embodiments of the present disclosure.

FIG. 2 is a block diagram of an apparatus for system-level in-system testing of a memory device in accordance with a number of embodiments of the present disclosure. FIG. 2 illustrates the switch board 202, which can be analogous to the switch board 102 described in association with FIG. 1. The switch board 202 includes a plurality of input channels 222 (IN_1, IN_2, IN_3, IN_4, IN_5, IN_6, IN_7, and IN_8). Although FIG. 2 illustrates the switch board 202 including eight input channels 222, embodiment of the present disclosure can include fewer than or greater than eight input channels 222. At least one of the input channels 222 can be configured to digitize an analog signal received by the switch board 202 from the SUT 204 (including the components illustrated within the dashed box). At least one of the input channels 222 can include or be coupled to an analog-to-digital converter (ADC). In at least one embodiment, the input channels 222 can be digital opto-isolated inputs for digital signals.

Each of the input channels 222 can be configured to receive an analog signal from the SUT 204, which can be analogous to the SUT 104 described in association with FIG. 1. A non-limiting example of such an analog signal is a general purpose input/output (GPIO) signal. A GPIO signal can be indicative of an event occurring in the SUT 204. For example, a GPIO can be indicative of a reboot of the SUT 204, anomalous or otherwise. A GPIO can be indicative of an initiation of a boot of the SUT 204.

The switch board 202 can include a plurality of relays 220 (SW0, SW1, SW2, SW3, SW4, SW5, SW6, and SW7) coupled to one or more of the input channels 222. At least one of the switches 220 can be a mechanical relay. In at least one embodiment, at least one of the relays 220 can be configured to cause a trigger signal (e.g., an external trigger signal) to be sent to one or more devices coupled to the switch board 202. For example, as illustrated in FIG. 2, the relays SW 6 and SW7 are configured to provide a trigger signal to a protocol analyzer and/or oscilloscope 224. The protocol analyzer and/or oscilloscope 224 can be coupled to a diagnostic computer 210 (represented by the double sided arrows labeled as "PC"), the SUT 204, and the memory device 206 of the SUT 204. A power supply 208, which can be analogous to the power supply 108 described in association with FIG. 1, can be coupled to the switch board 202. The power supply 208 can be used by the switch board 202 to provide a trigger signal to the protocol analyzer and/or oscilloscope 224.

In at least one embodiment, the switch board 202 can be configured to provide a trigger signal in response to a signal from the SUT 204 (e.g., a GPIO signal). As illustrated in FIG. 2, the relay SW6 is configured to receive a GPIO signal from the SUT 204. The switchboard 202 can be configured to provide a trigger signal in response to the GPIO being in a particular logical state (e.g., after being digitized). During system-level in-system testing of the memory device 206 of the SUT 204, the switch board 202 can be used to monitor one or more GPIO signals from the SUT 204. For example, a GPIO signal that indicates if a reboot of the SUT 204 as a result of a watchdog event has occurred can be monitored. In response to the GPIO signal indicating that a reboot of the SUT 204 as a result of a watchdog event has occurred (e.g., the GPIO toggling from logical "0" to logical "1"), the switch board 202 can provide a trigger signal to the protocol analyzer and/or oscilloscope 224. This can enable the protocol analyzer and/or oscilloscope 224 to record (e.g., store) communications (e.g., eMMC, UFS, or Serial Advanced Technology Attachment (SATA) interface or non-volatile memory express (NVMe) interface (protocol level communications for a SSD) between the memory device 206 and the SUT 204 directly subsequent to the reboot of the SUT 204, which can be helpful in determining a cause of the reboot, for example.

In at least one embodiment, the switch board 202 can be configured to provide one or more signals that simulate an input to the SUT 204 during operation of the SUT 204 (e.g., not during testing), hereinafter referred to as an event signal. As illustrated in FIG. 2, the SUT 204 includes an IVI system 203, however, embodiments of the present disclosure are not limited to the SUT 204 including an IVI system. The switch board 202 can be configured to provide a signal that simulates connection of a power supply of a vehicle (e.g., a car battery) to the IVI system 203. Other non-limiting examples of an event signal can include activation of a rearview camera (e.g., a back-up camera) and changing (e.g., shifting) gears. As illustrated in FIG. 2, switch SW1 of the switch board 204 is configured to receive power from the power supply 208 and an event signal ($S_{B+}$) to the IVI system 203 to simulate connection of a vehicle battery to the IVI system 203. The switch board 202 can be configured to provide a signal that simulates startup of a vehicle (e.g., turning a key or activation a startup button) to the IVI system 203. As illustrated in FIG. 2, switch SW0 of the switch board 204 is configured to receive power from the power supply 208 and an event signal ($S_{ACC}$) to the IVI system 203 to simulate startup of a vehicle.

The memory device 206 can be an SSD (e.g., with a SATA or NVMe interface). However, embodiments are not so limited. For example, the memory device 206 can be an eMMC or UFS. The memory device 206 can be coupled to the diagnostic computer 210 (e.g., via a ribbon cable) to receive datalog files from the memory device 206.

The memory device 206 can be coupled to the power supply 208. FIG. 2 shows multiple instances of the power supply 208 for ease of illustration but is not meant to imply that there are multiple power supplies. The power supply 208 can be coupled to multiple components and provide different voltage levels to each component. For example, a single power supply 208 can be configured to provide 3.3 volts to the switch board 202 for providing a trigger signal, provide twelve volts to the switch board 202 for providing event signals to the SUT 204, and provide up to twenty volts to the memory device 206. However, embodiments of the present disclosure are not limited to a single power supply 208 and can include multiple power supplies.

Figure 3:
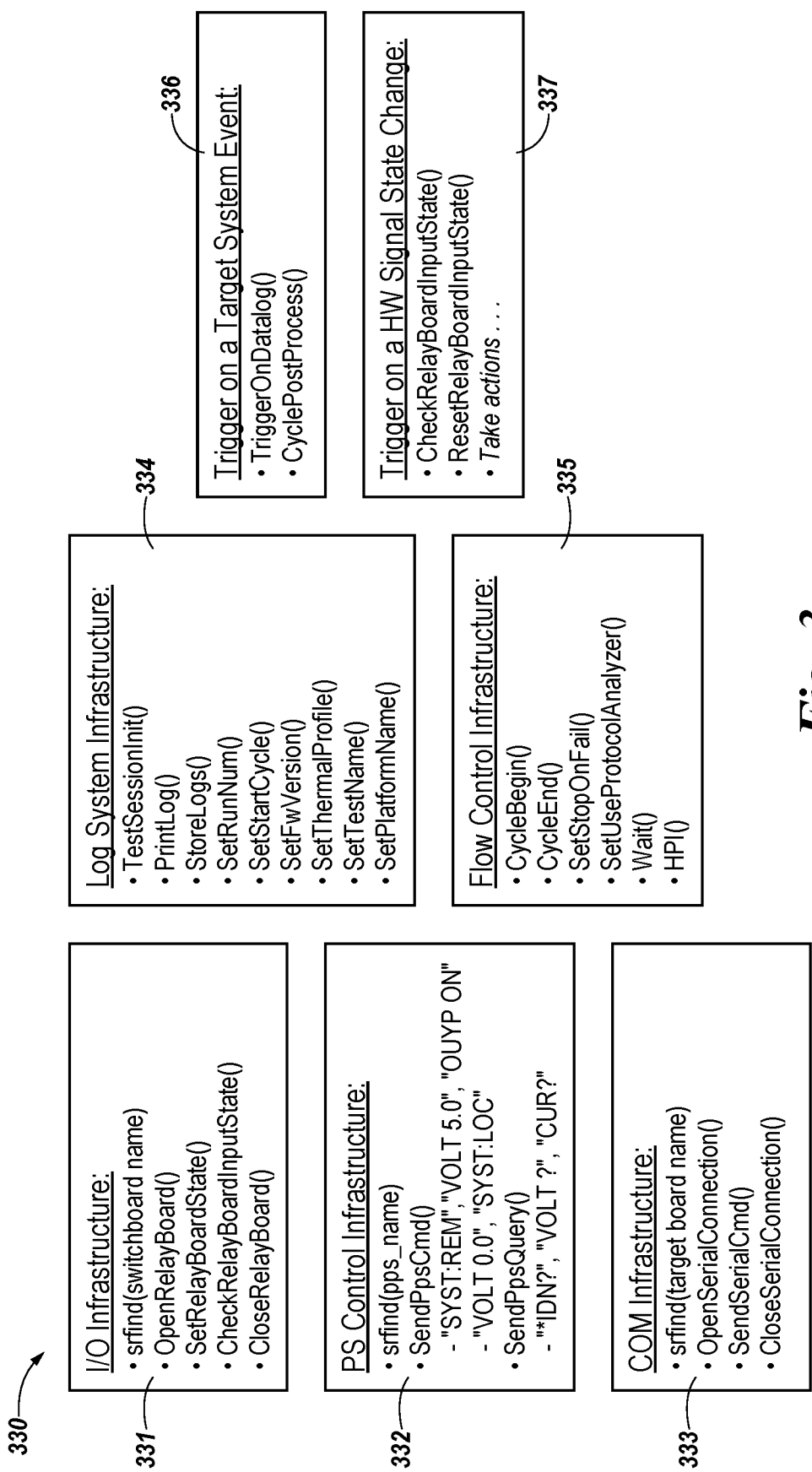
FIG. 3 is a block diagram of a library of functions for system-level in-system testing of a memory device in accordance with a number of embodiments of the present disclosure.

FIG. 3 is a block diagram of a library 330 of functions for system-level in-system testing of a memory device in accordance with a number of embodiments of the present disclosure. Embodiments of the present disclosure include a library of functions, such as the exemplary library 330 of functions. Functions can be selected from the library 330 and serve as "building blocks" for system-level in-system testing of a memory device in accordance with a number of embodiments of the present disclosure. In at least one embodiment, the functions can be API functions, such as those shown in FIG. 3. A user can design a test program using the library 330 of functions. Instead of writing all the code for a test program, a test program can include function calls to the library 330. This can reduce time to design a test program. The library 330 can be standardized to provide uniformity and/or repeatability across multiple test programs.

API functions of the library 330 can be used to access hardware and/or software components used in-system testing of a memory device. The library 330 can be a collection of C functions that a user can call from within a C function. To use functions from the library 330, a user can include a header file for the library 330 (e.g., lib.h) in a C test file. The header file can include prototypes for all the API functions. Functions of the library 330 can be organized according to the hardware infrastructure involved. For example, as illustrated in FIG. 3, the library 330 can include an I/O infrastructure group 331 of API functions to detect and connect to a switch board (e.g., the switch board 102 described in association with FIG. 1) and to manage its input-output peripherals. The library 330 can include a power supply (PS) control infrastructure group 332 of API functions to detect and connect to a power supply (e.g., the power supply 108) and to remotely manage its output terminals in order to force and/or read current levels and/or voltage levels. The library 330 can include a communications (COM) infrastructure group 333 of API functions to detect and connect to a SUT (e.g., the SUT 104), manage interaction with the SUT, sending commands to the SUT, and/or monitoring events occurring in the SUT. The library 330 can include a log system infrastructure group 334 of API functions to store a test session datalog file, an output stream from a SUT, and/or serial communication logs from a memory device. The library 330 can include a flow control infrastructure group 335 of API functions to control test flow sequences and/or control providing power to components (e.g., managing power ON/OFF iterations). The functions can be used to mark cycle begin and end points to synchronize sections of datalog files, such as a test session datalog file and a SUT datalog file. The library 330 can include a trigger on a target system event group 336 of API functions for event monitoring within a SUT (e.g., software environment of a SUT) and/or to manage synchronization of a test session event and event of a SUT. The library 330 can include a trigger on a hardware (HW) signal (e.g., a GPIO) to monitor hardware signals to trigger events (e.g., in a SUT) and/or collect related memory protocol traces (e.g., communications between a SUT and a memory device). Embodiments of the present disclosure are not limited to the API functions shown in FIG. 3. For example, the library can include additional functions not shown in FIG. 3 and/or a subset of the functions shown in FIG. 3. The functions can be used to parse and/or extract plots from data collected during in-system testing of a memory device. The functions can be used to generate reports and/or plots based on data collected during in-system testing of a memory device.

In at least one embodiment, a user (e.g., a customer or manufacturer of a SUT) can be aware of the functions available in the library 330 but be unaware of the coding of the functions. This enables a customer, for example, to design system-level in-system testing of a memory device of a SUT that best suits the customer's needs and the SUT while protecting intellectual property of the manufacturer of the memory device. The user does not need to have complete knowledge of the memory device to design a system-level in-system test of the memory device because the functions of the library 330 can be developed by a manufacturer of the memory device. The library 330 can be static and precompiled for users. To use the library 330, users can include a library file (e.g., lib.a) in their own binary at compilation time.

The following pseudocode is an exemplary test program for system-level in-system testing of a memory device in accordance with the present disclosure.

```
#include <stdio.h>
#include ".../Lib/lib.h
// Function prototypes
int Sample_Test(void);
// Variable declaration section
int ret, status;
int ud_plat;
...
int main()
{
  ret = Sample_Test();
  return ret;
}
int Sample_Test(void)
{
  TestSessionInit(TEST_LOG | PLAT_LOG);
  // TEST_LOG is a test session datalog file
  // PLAT_LOG is a SUT datalog file
  ud_plat = rfind("Odroid");
  OpenSerialConnection(ud_plat, ..., ...);
  testcycle = 1;
  do {
     CycleBegin(testcycle, TEST_LOG | PLAT_LOG);
     // Interaction with target board (send cmd, parse response, take
actions)
     ...
     if (TriggerOnDataLog(testcycle, logfname, "mytrigger", &Cnt, 120))
     {
        ...
     }
     CycleEnd(..., TEST_LOG | PLAT_LOG);
     if (HPI()) break;
  }
  // Test session shutdown activities
  CloseSerialConnection(...);
  StoreLogs(server_path, TEST_LOG | PLAT_LOG));
  ...
  return status;
}
```

Figure 4:
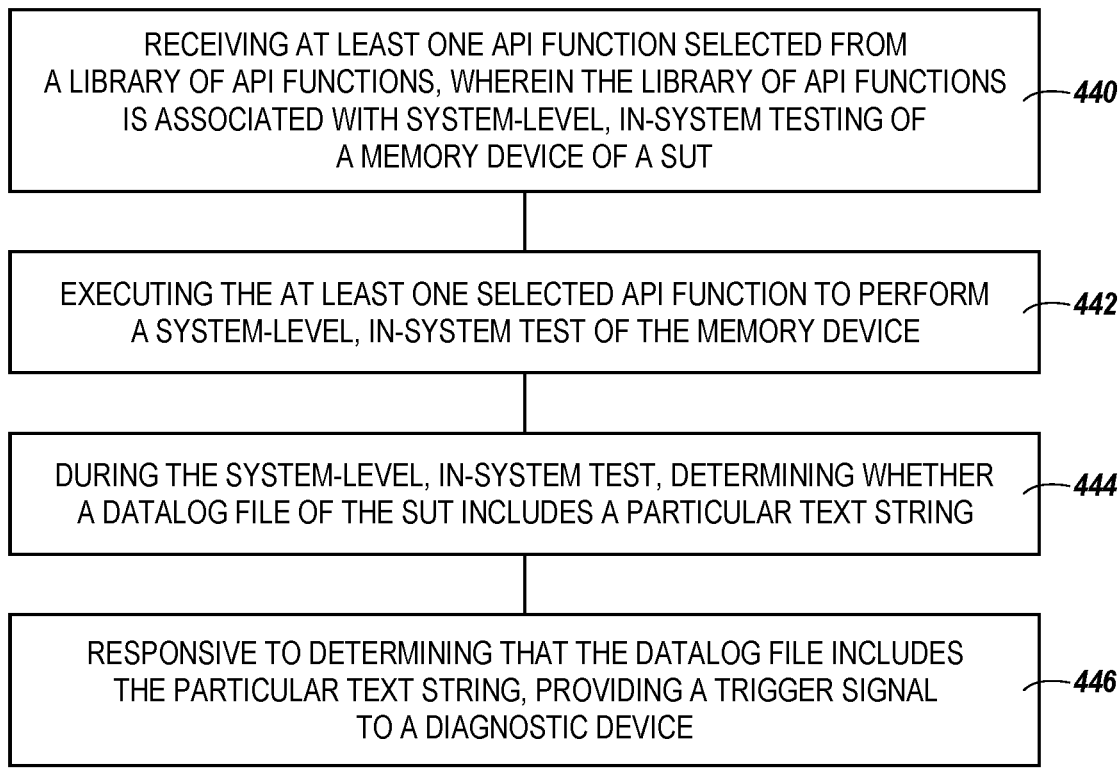
FIG. 4 is a flow diagram of a method for system-level in-system testing of a memory device in accordance with a number of embodiments of the present disclosure.

FIG. 4 is a flow diagram of a method for system-level in-system testing of a memory device in accordance with a number of embodiments of the present disclosure. At block 440, at least one API function selected from a library of API functions can be received. The library of API functions is associated with system-level in-system testing of a memory device of SUT. At block 442, the at least one selected API function can be executed to perform a system-level in-system test of the memory device. At block 444, whether a datalog file of the SUT includes a particular text string can be determined during the system-level in-system test. At block 446, a trigger signal can be provided to a diagnostic device in response to determining that the datalog file includes the particular text string.

Although not illustrated in FIG. 4, communications between the SUT and the memory device can be recorded with the diagnostic device in response to providing the trigger signal. An event of a test session datalog file can be synchronized with an event of the datalog file of the SUT associated with the particular text string in response to determining that the datalog file of the SUT includes the particular text string. A signal that simulates an error of the memory device can be input to the SUT in response to determining that the datalog file of the SUT includes the particular text string. Although not illustrated in FIG. 4, a first signal output from the SUT can be monitored and, responsive to detecting a change in a logical state of the first signal, inputting a second signal to the SUT that simulates an input to the SUT during operation of the SUT.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system for in-system testing of a memory device, comprising:
   a processing resource configured to receive a function, selected from a library of functions, to execute during an in-system test of a system under test (SUT) comprising an in-vehicle infotainment (IVI) system and a memory device thereof; and
   a switch board coupled to the processing resource and the SUT, wherein the processing resource is further configured to, during the in-system test of the SUT, provide a signal to the SUT that simulates an input that the SUT receives during operation of the SUT,
   wherein the processing resource and the switch board are distinct and decouplable from the SUT.

2. The system of claim 1, wherein the signal simulates startup of a vehicle including the IVI system.

3. The system of claim 1, wherein the signal simulates connection of a battery of a vehicle including the IVI system to the IVI system.

4. The system of claim 1, wherein the signal simulates activation of a rearview camera of a vehicle including the IVI system.

5. The system of claim 1, wherein the signal simulates changing gears of a vehicle including the IVI system.

6. The system of claim 1, wherein the first signal is a general purpose input/output (GPIO) signal of the SUT.

7. The system of claim 1, wherein the switch board is configured to:

digitize a signal from the SUT; and provide a trigger signal to a diagnostic device coupled to the switch board and the SUT in response to the digitized signal being in a particular logical state.

8. The system of claim 7, wherein the diagnostic device is configured to record communications between the memory device and another component of the SUT in response to receiving the trigger signal.

9. The system of claim 8, wherein the digitized signal being in the particular logical state is indicative of a reboot of the SUT.

10. The system of claim 1, wherein the memory device comprises a solid state drive (SSD) having a Serial Advanced Technology Attachment (SATA) interface or a non-volatile memory express (NVMe) interface.

11. The system of claim 1, wherein the memory device comprises an embedded multi-media controller (eMMC) or universal flash storage (UFS).

12. A method for in-system testing of a memory device, comprising:

during a system-level in-system test of a system under test (SUT) comprising an in-vehicle infotainment (IVI) system and a memory device thereof, determining, using a processing resource of a diagnostic device, whether a datalog file of the SUT includes a particular text string, wherein the diagnostic device is distinct and decouplable from the SUT; and responsive to determining that the datalog file includes the particular text string, providing a trigger signal to the processing resource of the diagnostic device.

13. The method of claim 12, further comprising, responsive to providing the trigger signal, recording communications between the memory device and another component of the SUT using the diagnostic device.

14. The method of claim 12, further comprising, responsive to determining that the datalog file of the SUT includes the particular text string, synchronizing an event of a test session datalog file with an event of the datalog file of the SUT associated with the particular text string.

15. The method of claim 12, further comprising, responsive to determining that the datalog file of the SUT includes the particular text string, inputting, using a switch board that is distinct and decouplable from the SUT, a signal that simulates an error of the memory device to the SUT.

16. The method of claim 12, further comprising:

monitoring, using the processing resource of the diagnostic device, a first signal output from the SUT; and responsive to detecting a change in a state of the first signal, inputting, using a switch board that is distinct and decouplable from the SUT, a second signal to the SUT that simulates an input to the SUT during operation of the SUT.

17. A non-transitory machine-readable medium storing a set of instructions for in-system testing of a memory device executable by a processing resource to:

during a system-level in-system test of a system under test (SUT) comprising an in-vehicle infotainment (IVI) system and a memory device thereof, detect, using a processing resource of a diagnostic device, a particular event of the SUT based on communications received from the SUT, wherein the diagnostic device is distinct and decouplable from the SUT;

responsive to detecting the particular event, record, using the diagnostic device, communications between the memory device and another component of the SUT; and responsive to detecting the particular event, synchronize, using the diagnostic device, the particular event and an event of a user selection of application programming interface (API) functions.

18. The medium of claim 17, wherein the instructions to detect the particular event comprise instructions executable to, using the diagnostic device:

monitor a general purpose input/output (GPIO) signal output from the SUT; and detect a change in the GPIO signal.

19. The medium of claim 17, wherein the instructions to detect the particular event comprise instructions executable to parse a datalog file of the SUT for an indication of the particular event.

* * * * *